(12) United States Patent
Jeon et al.

(10) Patent No.: US 7,935,635 B2
(45) Date of Patent: May 3, 2011

(54) METHOD OF FORMING FINE PATTERNS OF SEMICONDUCTOR DEVICES USING DOUBLE PATTERNING

(75) Inventors: Kyung-yub Jeon, Yongin-si (KR); Myeong-cheol Kim, Suwon-si (KR); Doo-youl Lee, Seoul (KR); Hak-sun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 658 days.

(21) Appl. No.: 12/073,502

(22) Filed: Mar. 6, 2008

(65) Prior Publication Data
US 2008/0220611 A1    Sep. 11, 2008

(30) Foreign Application Priority Data
Mar. 8, 2007   (KR) .................. 10-2007-0023146

(51) Int. Cl.
*H01L 21/302*  (2006.01)
*H01L 21/461*  (2006.01)

(52) U.S. Cl. .................... 438/689; 216/47; 438/706
(58) Field of Classification Search .............. 216/41, 216/47; 438/689, 700, 706, 710, 719, 736
See application file for complete search history.

(56) References Cited

FOREIGN PATENT DOCUMENTS
| KR | 100155880 | 7/1998 |
|----|-----------|--------|
| KR | 1020060110097 | 10/2006 |
| KR | 1020060110706 | 10/2006 |

*Primary Examiner* — Roberts Culbert
(74) *Attorney, Agent, or Firm* — Harness, Dickey & Pierce, P.L.C.

(57) ABSTRACT

A method of forming fine patterns of semiconductor device according to an example embodiment may include forming a plurality of multi-layered mask patterns by stacking first mask patterns and buffer mask patterns on an etch film to be etched on a substrate, forming, on the etch film, second mask patterns in spaces between the plurality of multi-layered mask patterns, removing the second mask patterns to expose upper surfaces of the first mask patterns, and forming the fine patterns by etching the etch film using the first and second mask patterns as an etch mask. This example embodiment may result in the formation of diverse dimensions at diverse pitches on a single substrate.

22 Claims, 11 Drawing Sheets

METHOD OF FORMING FINE PATTERNS OF SEMICONDUCTOR DEVICES USING DOUBLE PATTERNING

PRIORITY STATEMENT

This application claims priority under 35 U.S.C. §119 to Korean Patent Application No. 10-2007-0023146, filed on Mar. 8, 2007, in the Korean Intellectual Property Office, the entire contents of which are incorporated herein by reference.

BACKGROUND

1. Field

Example embodiments are directed to methods of forming fine patterns of semiconductor devices, for example, a method of forming fine patterns of a semiconductor device using hardmask patterns at a fine pitch.

2. Description of the Related Art

To fabricate highly integrated semiconductor devices, reducing pattern size may be necessary. To integrate elements in a relatively small area, the individual elements may have relatively small dimensions. This may be possible by reducing the pitch of a desired pattern to be formed, where the pitch is the sum of the width and the gap between adjacent patterns. Currently, the decrease of the design rule of semiconductor devices may be limited due to photolithographic resolution restrictions. For example, forming a desired pattern with a fine pitch may be limited because of the resolution restrictions of photolithography for forming an isolation region defining an active region in a substrate and forming a line and space (L/S) pattern.

To overcome photolithographic resolution restrictions, methods of forming hard mask patterns with a fine pitch using double patterning may be used.

In this example, simultaneous formation of given patterns may be desired in a region having a relatively high pattern density, such as a cell array region, or in a region having a relatively low pattern density, such as a peripheral circuit region or core region.

When applying double patterning, if patterns with different pitches are simultaneously formed in respective regions, each having desired pattern densities or pattern widths that may be different from one another, differences of etch rates and etch depths in respective regions caused by the difference in pattern densities or pattern widths in respective regions may become problematic.

SUMMARY

Example embodiments are directed to a method of forming fine patterns of a semiconductor device that may reduce or overcome problems resulting from differences of etch rates and etch depths in regions that may have different pattern densities or pattern widths when patterns may have diverse dimensions and diverse pitches in a single substrate using double patterning for realizing patterns at fine pitches which may reduce or overcome photolithographic resolution restrictions.

Example embodiments provide a method of forming fine patterns for a semiconductor device that may include forming a plurality of multi-layered mask patterns that may be obtained by stacking first mask patterns and buffer mask patterns on an etch film that may be etched on a substrate, forming second mask patterns that may have upper surfaces lower than upper surfaces of the multi-layered mask patterns on the etch film in spaces between the plurality of multi-layered mask patterns, removing the buffer mask patterns to expose the upper surfaces of the first mask patterns, and forming the fine patterns by etching the etch film using the first mask patterns and the second mask patterns as an etch mask.

The method may further include forming a hardmask layer on the substrate, forming the etch film on the hardmask layer, and forming hardmask patterns by etching the hardmask layer using the first mask patterns and the second mask patterns as an etch mask. For example, the etch film may be etched using the first mask patterns, the second mask patterns and the hardmask patterns as an etch mask to form the fine patterns.

Example embodiments of forming the plurality of multi-layered mask patterns may further include forming a first mask layer on the etch film of the substrate, forming a buffer mask layer by depositing a material different than a material that comprises the first mask layer on the first mask layer, and forming the first mask patterns and the buffer mask patterns by patterning the buffer mask layer and the first mask layer using photolithography.

Example embodiments of forming of the plurality of multi-layered mask patterns may further include, forming a first mask layer on the etch film of the substrate, forming a buffer mask layer by oxidizing the first mask layer to a depth from an upper surface thereof, and forming the first mask patterns and the buffer mask patterns by patterning the buffer mask layer and the first mask layer using photolithography. In a further example, oxidizing the first mask layer may be carried out to a predetermined depth.

Example embodiments of forming the second mask patterns may further include forming a buffer layer that may cover upper surfaces and sidewalls of the plurality of multi-layered mask patterns which may result in recesses in spaces between the multi-layered mask patterns, forming a second mask layer on the buffer layer that may fill insides of the recesses, and forming the second mask patterns having upper surfaces at a first height by removing the second mask layer until the buffer layer may be exposed at the upper surfaces of the multi-layered mask patterns to form the second mask patterns. For example, the recesses in spaces between the multi-layered mask patterns may be formed to a predetermined width. In a further example, the second mask patterns may be formed only within the recesses.

After forming the second mask patterns having the upper surfaces at the first height, example embodiments of forming the second mask patterns may further include removing a thickness from the upper surfaces of the second mask patterns having the first height using the exposed buffer layer as an etch mask to form the second mask patterns having a second height that may be smaller than the first height and, simultaneously, to expose portions of the buffer layer that cover the sidewalls of the buffer mask patterns within the recesses. The second height may be equal to the height of the first mask patterns. The thickness removed from the upper surfaces of the second mask patterns may be predetermined, for example.

Example embodiments may further include removing the exposed portions of the buffer layer using the second mask patterns which may have the second height as an etch mask, wherein the buffer mask patterns may be removed during removal of the exposed portions of the buffer layer. For example, the buffer mask patterns and the exposed portions of the buffer layer may be removed simultaneously.

Example embodiments provide a method of forming fine patterns of a semiconductor device that may include forming an etch film that may be etched on a substrate that may include a first region and a second region, forming a plurality of multi-layered mask patterns that may be obtained by stacking first mask patterns and buffer mask patterns on the etch film which may create a first pattern density in the first region and a second pattern density that may be greater than the first pattern density in the second region, forming, only in the second region, second mask patterns that may have upper surfaces lower than those of the multi-layered mask patterns on the etch film in spaces between the plurality of multi-layered mask patterns, removing the buffer mask patterns, which may expose the upper surfaces of the first mask patterns in the first region and the second region, and forming fine patterns that may have different pattern densities in the first region and the second region by etching the etch film using the first mask patterns as an etch mask in the first region and by etching the etch film using the first mask patterns and the second mask patterns as an etch mask in the second region.

Therefore, according to example embodiments, fine patterns may be formed on the substrate using double patterning, while reducing and/or preventing unnecessary film materials from remaining on the substrate. Example embodiments further show that inconsistent etching, possibly resulting from the height difference of the first mask patterns and the second mask patterns used as the etch mask, can be reduced and/or prevented. In examples when the patterns of diverse dimensions with diverse pitches on the single substrate using double patterning may be simultaneously formed, the etch process margin may be secured sufficiently to reduce or overcome problems caused by differences of an etch rate and an etch depth in respective regions. According to example embodiments, patterns with fine pitch that overcome photolithographic resolution restrictions may be realized.

BRIEF DESCRIPTION OF THE DRAWINGS

Example embodiments will become more apparent by the detailed description of example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1A:
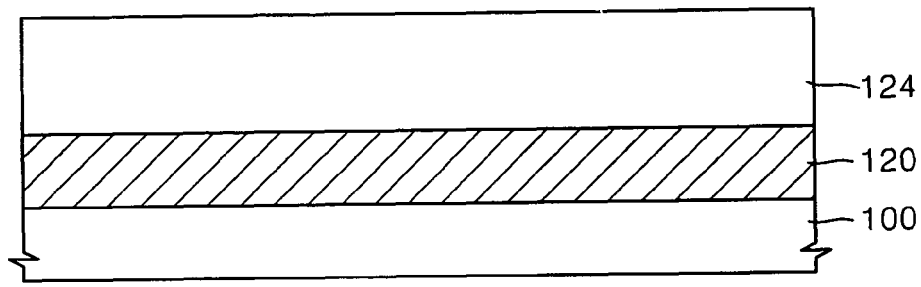
FIGS. 1A through 1M are sectional views illustrating a method of forming fine patterns of a semiconductor device according to an example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIGS. 1A through 1M are sectional views illustrating a method of forming fine patterns of a semiconductor device according to an example embodiments.

Referring to FIG. 1A, an etch film 120 that is to be etched may be formed on a substrate 100, and then a hardmask layer 124 may be formed on the etch film 120.

The substrate 100 may be a semiconductor substrate such as a silicon substrate or the like. The etch film 120 may be a conductive layer or an insulating layer, for example. The etch film may be used for forming a plurality of conductive patterns or conductive pads that may be formed repeatedly at fine pitches to construct the semiconductor device. The etch film 120 may be composed of metal, a semiconductor material, or an insulating material, or combinations thereof.

Example embodiments of the hardmask layer 124 may be composed of the same material as the etch film 120 or various materials according the desired patterns or use. For example, the hardmask layer 124 may be an oxide film, a nitride film, a combination of these films or the like. If the etch film 120 is an insulating film or a conductive film, a material capable of providing an etch selectivity according to the material of an etch film 120 may be used as the hardmask layer 124. For example, the hardmask layer 124 may be composed of at least one oxide film selected from a group that may include a thermal oxide film, a chemical vapor deposition (CVD) oxide film, an undoped silicate glass (USG) film and/or a high density plasma (HDP) oxide film or other like films. In an alternative example, the hardmask layer 124 may be at least one film selected from a group including SiON, SiN, SiBN and BN or other like films. In other example embodiments, the hardmask layer 124 may have multiple layers that may consist of at least one oxide film and/or a nitride film.

Figure 1B:
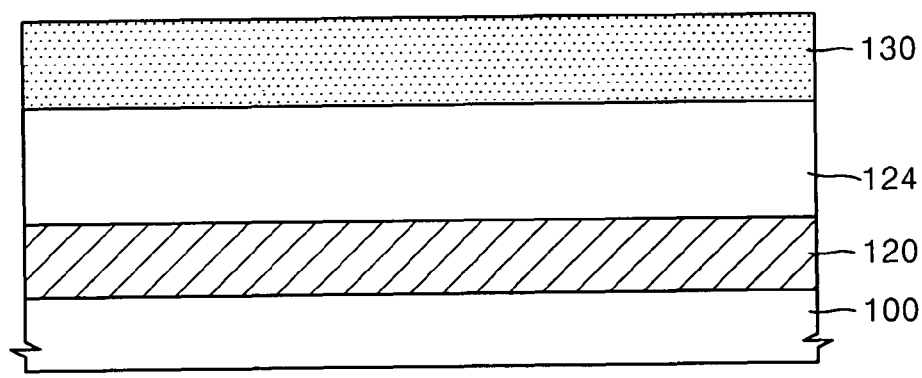

Referring to FIG. 1B, an example embodiment of a first mask layer 130 may be formed on the hardmask layer 124. The first mask layer 130 may be composed of a polysilicon film and/or a nitride film such as SiON, SiN, SiBN and BN, or the like. When the hardmask layer 124 is composed of a nitride film, the first mask layer 130 may be an oxide film or a polysilicon film or the like, for example.

Figure 1C:
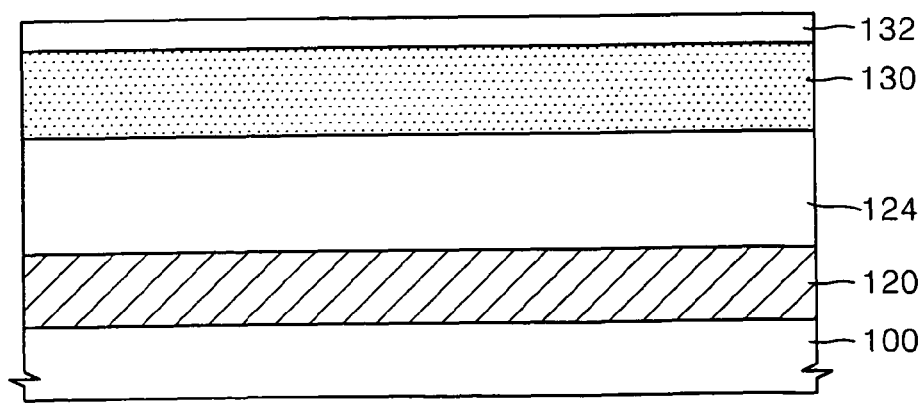

Referring to FIG. 1C, a buffer mask layer 132 may be formed on the first mask layer 130.

The buffer mask layer 132 may be formed to form (e.g., secure) a process margin in connection with over-etching. For example, the buffer mask layer 132 may be formed when etching is performed to create second mask patterns.

The buffer mask layer 132 may be composed of a material having etch characteristics similar or substantially similar to those of the hardmask layer 124. For example, the buffer mask layer 132 may be composed of the same material as the hardmask layer 124. In alternative examples, the buffer mask layer 132 may be composed of a material different from that of hardmask layer 124, although the material of the buffer mask layer 132 may have etch characteristics similar to the material of the hardmask layer 124. For example, each of the hardmask layer 124 and the buffer mask layer 132 may be an oxide film or the like.

Figure 1D:
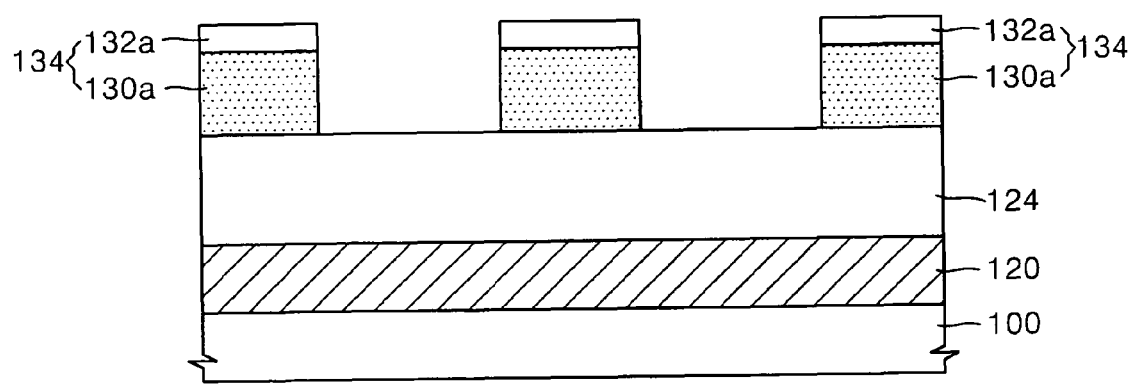

Referring to FIG. 1D, the buffer mask layer 132 and the first mask layer 130 may be patterned using photolithography to form a plurality of first mask patterns 130a and a plurality of buffer mask patterns 132a. The plurality of first mask patterns 130a and buffer mask patterns 132a may form a plurality of multi-layered mask patterns 134.

Figure 1E:
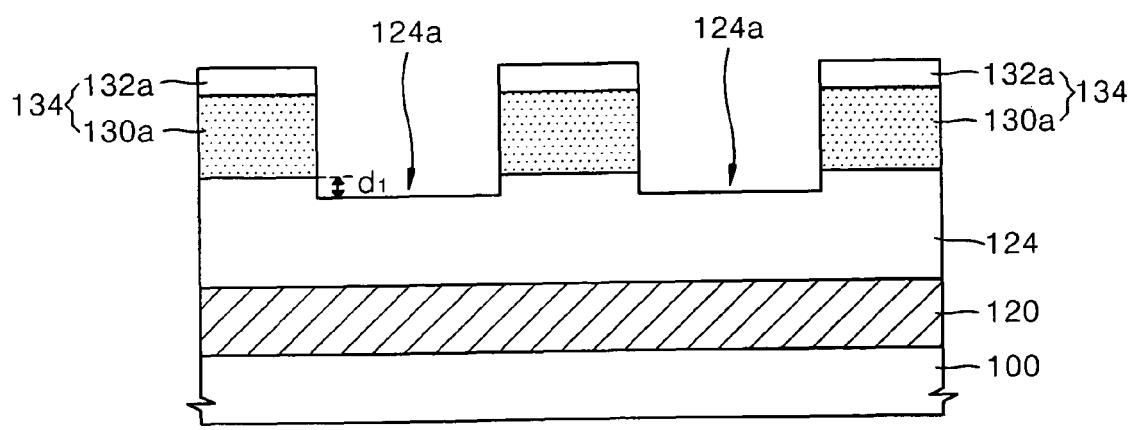

Referring to FIG. 1E, an upper portion of the hardmask layer 124 may have a first thickness $d_1$, which may be exposed between the multi-layered mask patterns 134, may be removed from an upper surface thereof, to form lower surface portions 124a of the hardmask layer 124.

For example, in order to form the lower surface portions 124a on the upper surface of the hardmask layer 124, dry etching may be performed. As example embodiments show, when performing dry etching to form the first mask patterns 130a and the buffer mask patterns 132a, for example as shown in FIG. 1D, over-etching may be performed to form the lower surface portions 124a. In alternative example embodiments, dry etching for forming the lower surface portions 124a may be separately performed.

Figure 1F:
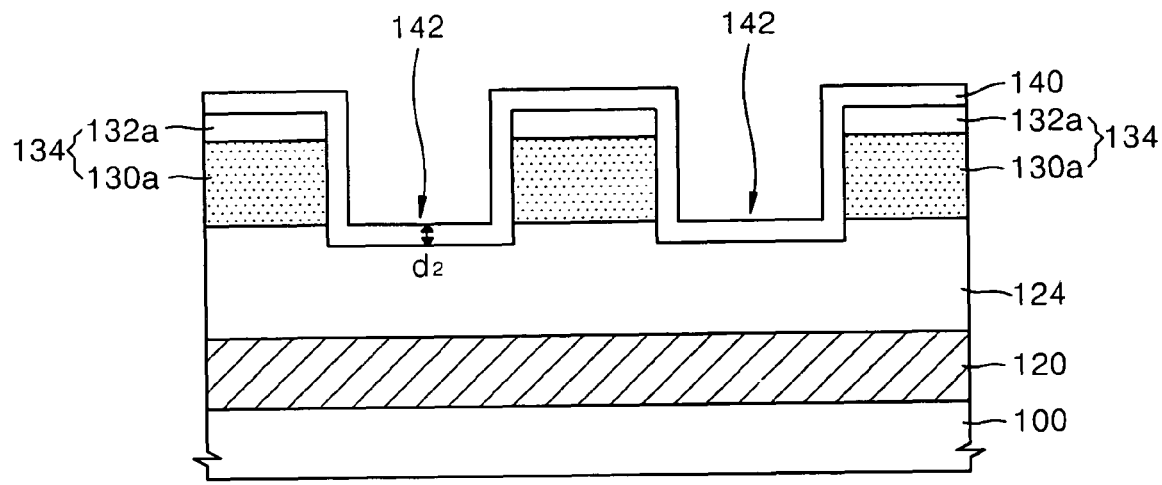

Referring to FIG. 1F, a buffer layer 140 may be formed on sidewalls and upper surfaces of the plurality of multi-layered mask patterns 134 and on the hardmask layer 124 exposed between the multi-layered mask patterns 134. Recesses 142 may be formed in the upper surface of the buffer layer 140 between the plurality of multi-layered mask patterns 134.

The buffer layer 140 may be formed to have a second thickness $d_2$ that may be approximately equal to the first thickness $d_1$ of FIG. 1E. The buffer layer 140 may cover (e.g., consistently cover) any or all of the upper surfaces and the sidewalls of the buffer mask patterns 132a, the sidewalls of the first mask patterns 130a and the lower surface portions 124a of the hardmask layer 124.

The buffer layer 140 may be composed of a material with etch characteristics similar or substantially similar to those of the hardmask layer 124. For example, the buffer layer 140 may be composed of the same material as the hardmask layer 124. In alternative example embodiments, the buffer layer 140 may be composed of a material different from the material of the hardmask layer 124, but may have similar or substantially similar etch characteristics. For example, the hardmask layer 124, the buffer mask patterns 132a and the buffer layer 140 may each be formed as oxide films or the like. In another example, the buffer layer 140 may be composed of an oxide film or a nitride film formed by atomic layer deposition (ALD). In a further example, if the first mask patterns 130a are polysilicon, the hardmask layer 124 and/or the buffer mask patterns 132a may be a plasma enhanced oxide (PEOX) film, and the buffer layer 140 may be an oxide film formed by ALD, for example.

Figure 1G:
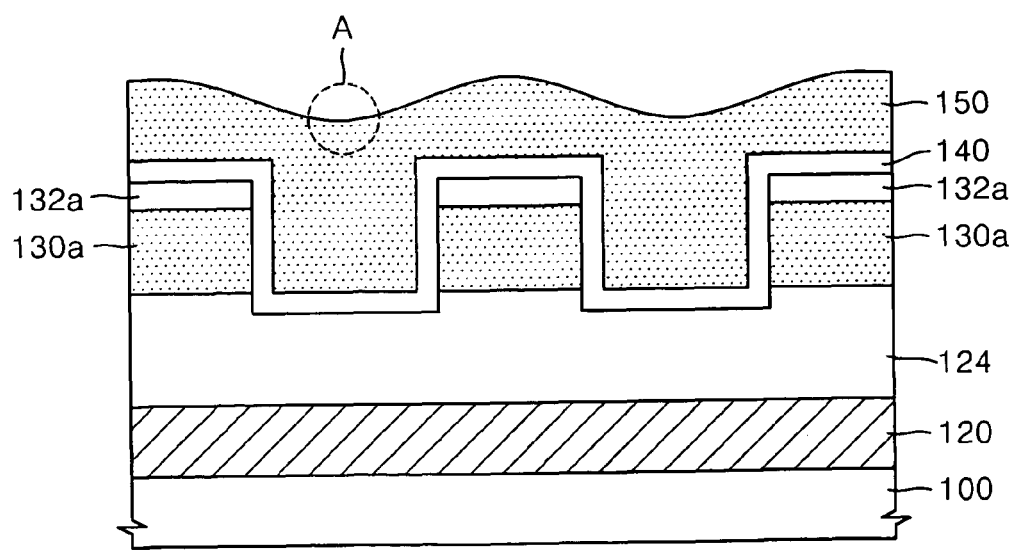

Referring to FIG. 1G, the second mask layer 150 may be formed on the buffer layer 140. The second mask layer 150 may be thick enough to fill the insides of the recesses 142.

The second mask layer 150 may be composed of a material having etch characteristics similar or substantially similar to those of the first mask layer 130. The second mask layer 150 may be composed of the same material as the first mask layer 130, or a different material which may have similar or substantially similar etch characteristics. For example, each of the first mask layer 130 and the second mask layer 150 may be composed of polysilicon or the like. In alternative examples, the first mask layer 130 may be a nitride film or the like, and the second mask layer 150 may be a polysilicon film or the like, or vice versa.

Grooves A may be formed in the upper surface of the second mask layer 150 due to the formation of the first mask patterns 130a and the buffer mask patterns 132a.

Figure 1H:
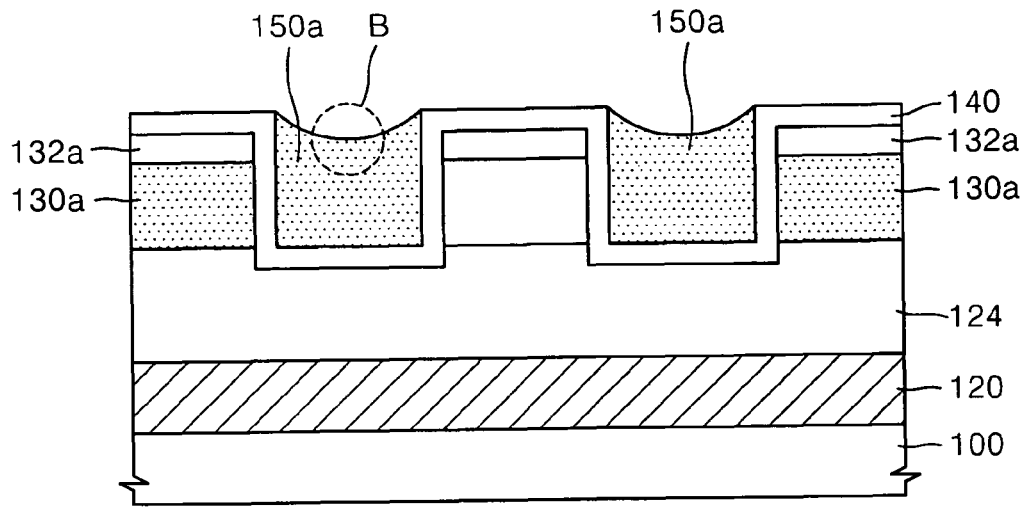

Referring to FIG. 1H, the second mask layer 150 may be partially removed until an upper surface of the buffer layer 140 is exposed at the upper surfaces of the first mask patterns 130a, so that second mask patterns 150a are formed within the recesses 142 between stacked structures of the first mask patterns 130a and the buffer mask patterns 132a. Wet etching may be used to partially remove the second mask layer 150.

Grooves B may be formed in upper surfaces of the second mask patterns 150a due to the presence of grooves A. The upper surfaces of the second mask patterns 150a may be lower than upper surfaces of the buffer mask patterns 132a, for example. Therefore, if example embodiments of the process described in FIG. 1F through 1H are carried out when the buffer mask patterns 132a are not formed on the first mask patterns 130a, height differences may occur between the first mask patterns 130a and the second mask patterns 150a caused by the grooves B formed in the second mask patterns 150a may result in inconsistent etching if subsequent etching is performed.

To suppress and/or prevent inconsistent etching, methods according to the process described by example embodiments may be performed. Thus, as described in FIG. 1I, the second mask patterns 150a may be over-etched to make the height of the second mask patterns 150a equal or substantially equal to the height of the first mask patterns 130a while securing a sufficient etch process margin. The etch process margin may be as a large as the height of the buffer mask patterns 132a, for example.

Figure 1I:
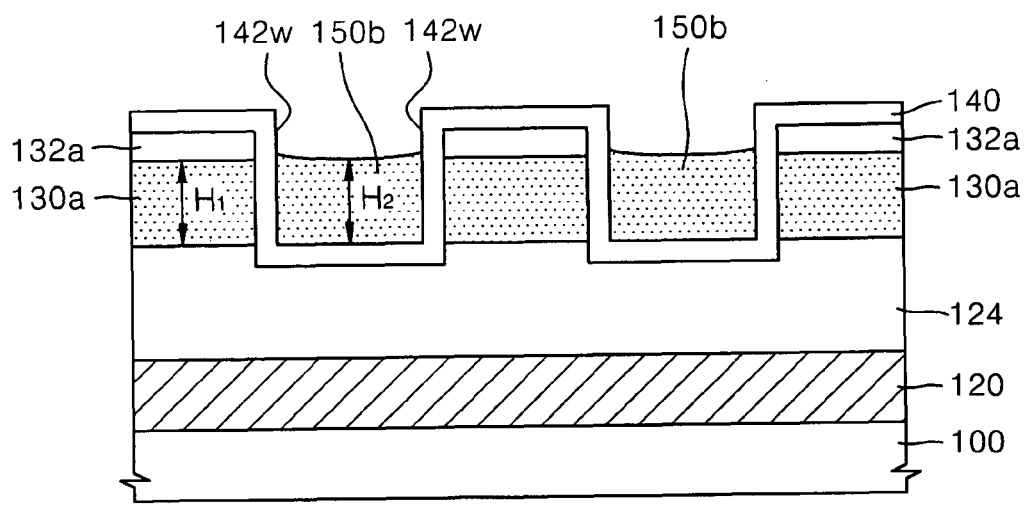

Referring to FIG. 1I, if the etch process margin is as large as the height of the buffer mask patterns 132a, the second mask patterns 150a may be over-etched to make a height $H_2$ of the second mask patterns 150a approximately equal to a height $H_1$ of the first mask patterns 130a, to form second mask patterns 150b having upper surfaces level or substantially level with the upper surfaces of the first mask patterns 130a may be formed. Consequently, the buffer layer 140 covering the sidewalls of the buffer mask patterns 132a may be exposed within portions of inner sidewalls 142w of the recesses 142.

Figure 1J:
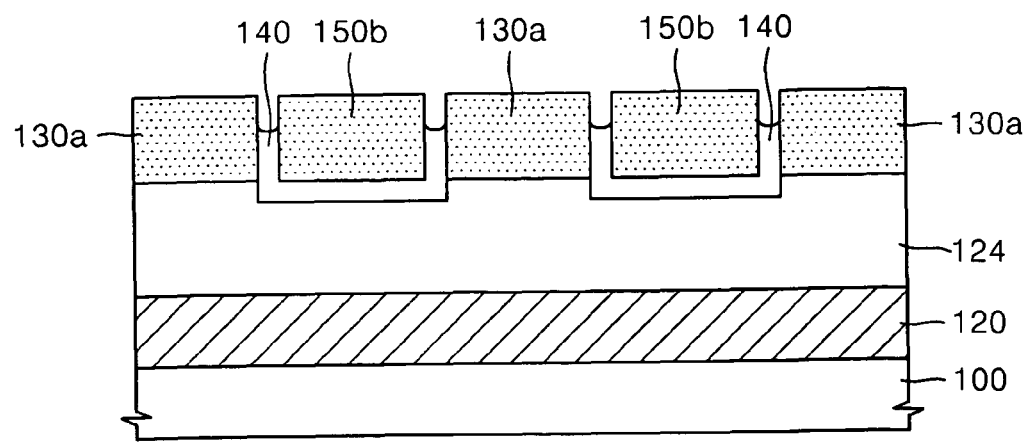

Referring to FIG. 1J, using the second mask patterns 150b as an etch mask, the exposed portions of the buffer layer 140 and the buffer mask patterns 132a covering the first mask patterns 130a may be removed to expose upper surfaces of the first mask patterns 130a, and structure exposing the upper surfaces of the first mask patterns 130a and the second mask patterns 150b may be formed. In additional examples, the upper surfaces of the first mask patterns 130a and the second mask patterns 150b may be simultaneously exposed.

According to example embodiments, wet etching or dry etching may be used to remove the exposed portions of the buffer layer 140 and the buffer mask patterns 132a. For example, when each of the first mask patterns 130a and the buffer mask patterns 132a is an oxide-based film or the like, the same or substantially the same etch conditions may be applied.

Figure 1K:
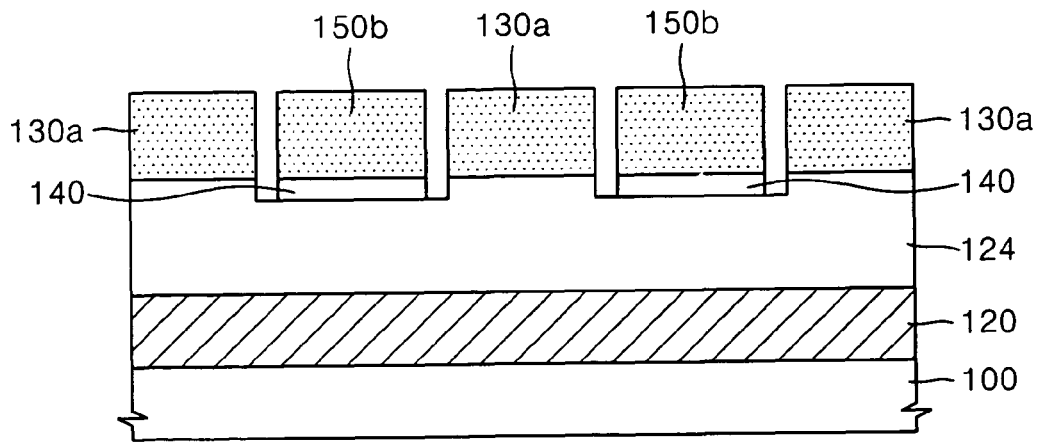

Referring to FIG. 1K, a portion of the buffer layer 140 exposed between the first mask patterns 130a and the second mask patterns 150b may be removed using the first mask patterns 130a and the second mask patterns 150b as an etch mask, so that the hardmask layer 124 is exposed between the first mask patterns 130a and the second mask patterns 150b.

Figure 1L:
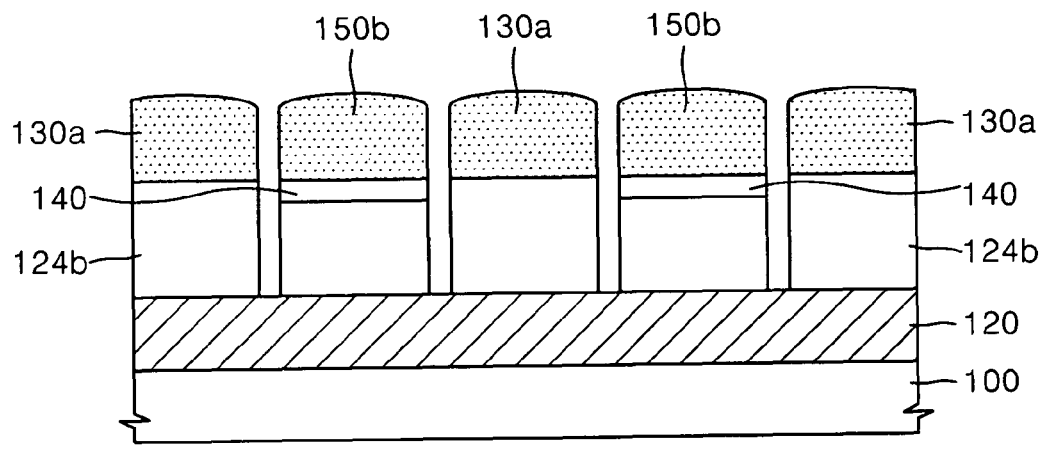

Referring to FIG. 1L, the hardmask layer 124 may be etched using the first mask patterns 130a and the second mask patterns 150b as an etch mask, forming hardmask patterns 124b which may expose upper surfaces of the etch film 120.

During the etching of the hardmask layer 124, the first mask patterns 130a and the second mask patterns 150b may be partially etched as illustrated in FIG. 1L.

Figure 1M:
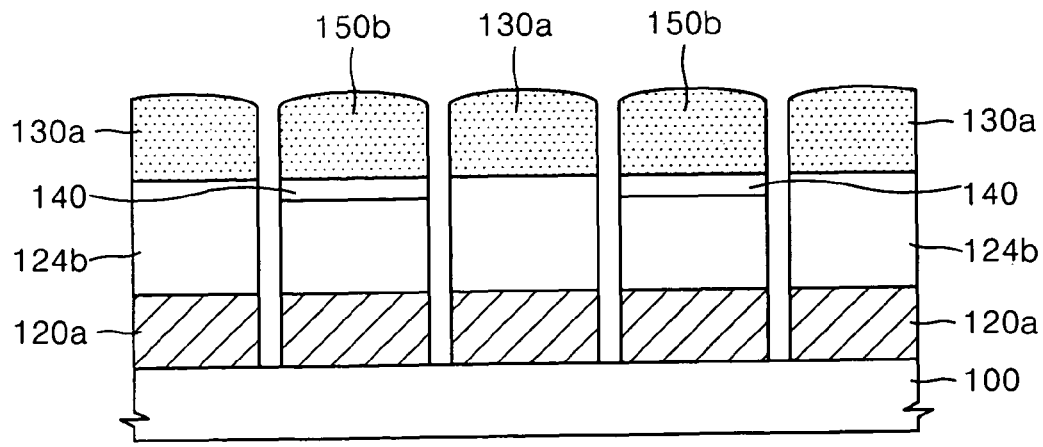

Referring to FIG. 1M, the etch film 120 may be etched (e.g., anisotropically dry etched) to form fine patterns 120a, using the hardmask patterns 124b, along with the first mask patterns 130a and the second mask patterns 150b which remain on the hardmask patterns 124b.

When etching the etch film 120 to form the fine patterns 120a, anisotropic dry etching may be performed using the first mask patterns 130a and the second mask patterns 150b formed by double patterning. Accordingly, the fine patterns 120a with a fine pitch exceeding photolithographic resolution restrictions may be achieved. When the first mask patterns 130a and the second mask patterns 150b are formed by double patterning, the second mask patterns 150b may be formed when the buffer mask patterns 132a are formed on the first mask patterns 130a. In another example, the buffer mask patterns 132a may be formed to have a given or desired thickness. Thus, upper surfaces of the second mask patterns 150a may be made approximately level with the upper surfaces of the first mask patterns 130a by over-etching the second mask patterns 150a while the sufficient etch process margin is achieved by the thickness of the buffer mask patterns 132a. Therefore, an inconsistent etching resulting from the height difference of the first mask patterns 130a and the second mask patterns 150a may be reduced and/or prevented.

Figure 2A:
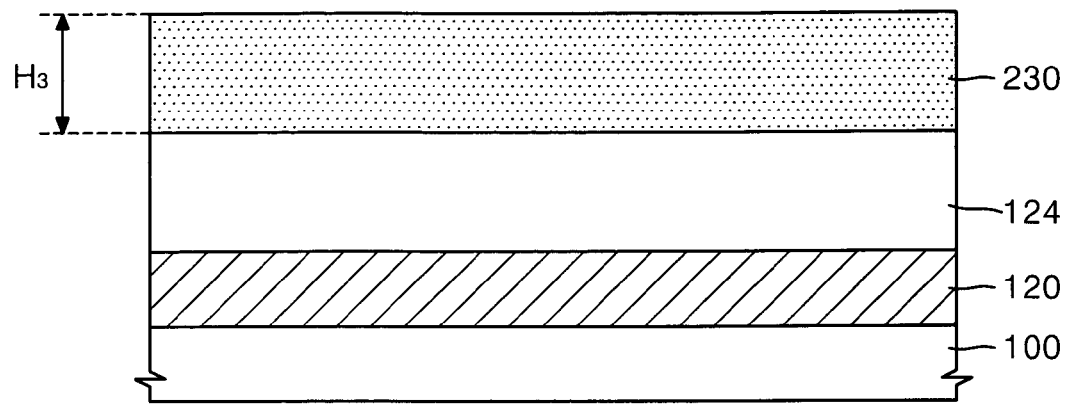
FIGS. 2A and 2B are sectional views illustrating a method of forming fine patterns of a semiconductor device according to example embodiments.
Figure 2B:
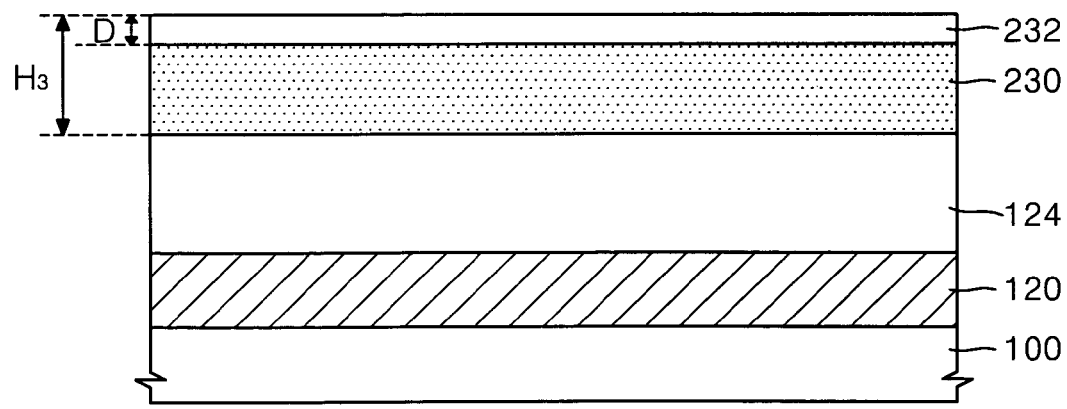

FIGS. 2A and 2B are sectional views illustrating example embodiments of a method of forming fine patterns of a semiconductor device.

Example embodiments as shown in FIGS. 2A and 2B may differ from the previous example embodiments discussed in conjunction with FIGS. 1A through 1M. For example, in the previous example embodiments, the buffer mask layer 132 may be separately formed as another film on the first mask layer 130. In the example embodiments depicted in FIGS. 2A and 2B, a buffer mask layer 230a may be formed by partially oxidizing a first mask layer 230.

Referring to FIG. 2A, after an etch film 120 and a hardmask layer 124 may be formed on substrate 100 with regard to FIG. 1A, a first mask layer 230 may be formed on the hardmask layer 124, in a similar or substantially similar manner to the forming of the first mask layer 130 described by example embodiments shown in FIG. 1B. However, example embodiments of the first mask layer 230 may have a height $H_3$ greater than the height $H_1$ of the first mask patterns 130a. The height $H_1$ of the desired first mask patterns 130a and an etch process margin for over-etching to form second mask patterns 150b are factors that may be considered in determining the height $H_3$ of the first mask layer 230.

Referring to FIG. 2B, the first mask layer 230 may be oxidized to a depth D from the upper surface thereof, and a buffer mask layer 232 formed from a portion of the first mask layer 230 may be formed. The depth D from the upper surface of the first mask layer 230 may be given.

To form the buffer mask layer 232, a resultant structure having the first mask layer 230 thereon may be thermally treated in an oxidation ambient. For example, the forming of the buffer mask layer 232 may be highly useful when the first mask layer 230 is composed of, for example, polysilicon or the like. The buffer mask layer 232 may act as a buffer allowing for sufficient over-etching when subsequent second mask patterns 150a are formed using etching.

In subsequent example embodiments, fine patterns 120a may be formed as shown in FIGS. 1D through 1M.

FIGS. 3A through 3K are sectional views illustrating example embodiments of a method of forming fine patterns of a semiconductor device.

Figure 3A:
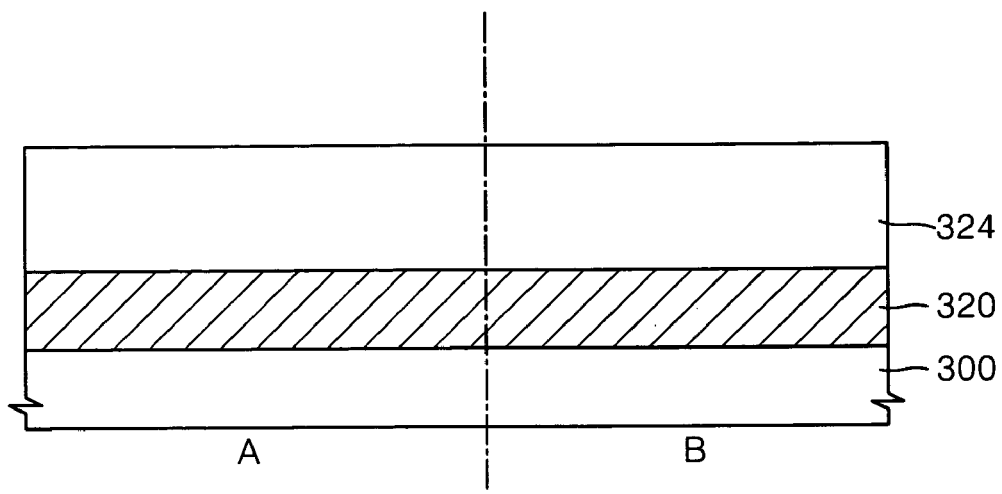
FIGS. 3A through 3K are sectional views illustrating a method of forming fine patterns of a semiconductor device according to example embodiments.

Referring to FIG. 3A, an etch film 320 and a hardmask layer 324 may be formed on a substrate 300. For example, an etch film 320 and a hardmask layer 324 may be formed on both a lower-density pattern region A and a higher-density pattern region B included in a substrate 300.

Example embodiments of the substrate 300 may be a semiconductor substrate such as a silicon substrate or the like. The lower-density pattern region A of the substrate 300 may have patterns formed therein having a relatively low pattern density per unit area, which may be a peripheral circuit region or a core region. According to alternative example embodiments, the lower-density pattern region A may be a portion of a cell array region, where a density of desired patterns is relatively low. For example, the higher-density pattern region B may have patterns formed therein having a higher pattern density per unit area than that of the lower-density pattern region A, which may be a portion of a cell array region.

The etch film 320 and the hardmask layer 324 may be the same or substantially the same the etch film 120 and the hardmask layer 124 shown in FIG. 1A.

Figure 3B:
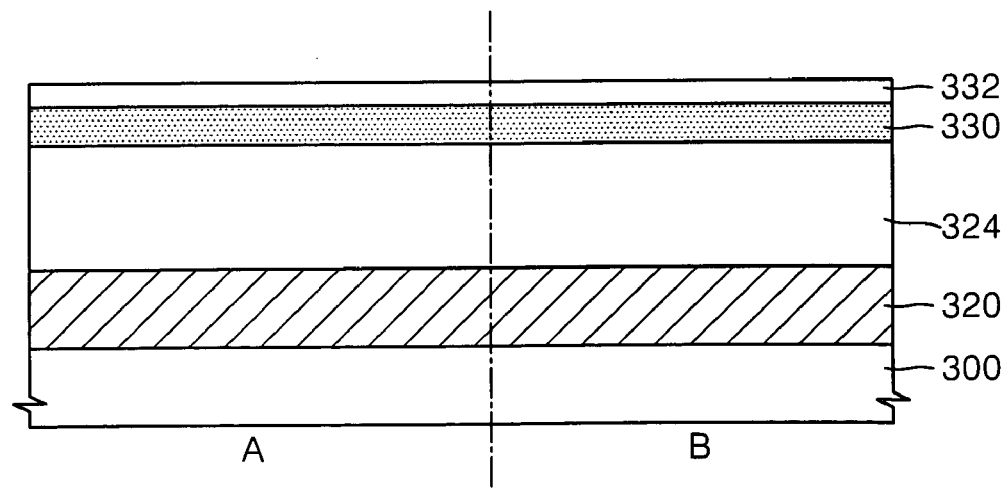

Referring to FIG. 3B, a first mask layer 330 and a buffer mask layer 332 may be formed on the hardmask layer 324.

The first mask layer 330 and the buffer mask layer 332 may be the same or substantially the same the first mask layer 130 and the buffer mask layer 132 shown FIGS. 1B and 1C. To form the first mask layer 330 and the buffer mask layer 332, to the method or process shown in FIGS. 1B and 1C or in FIGS. 2A and 2B may be used.

Figure 3C:
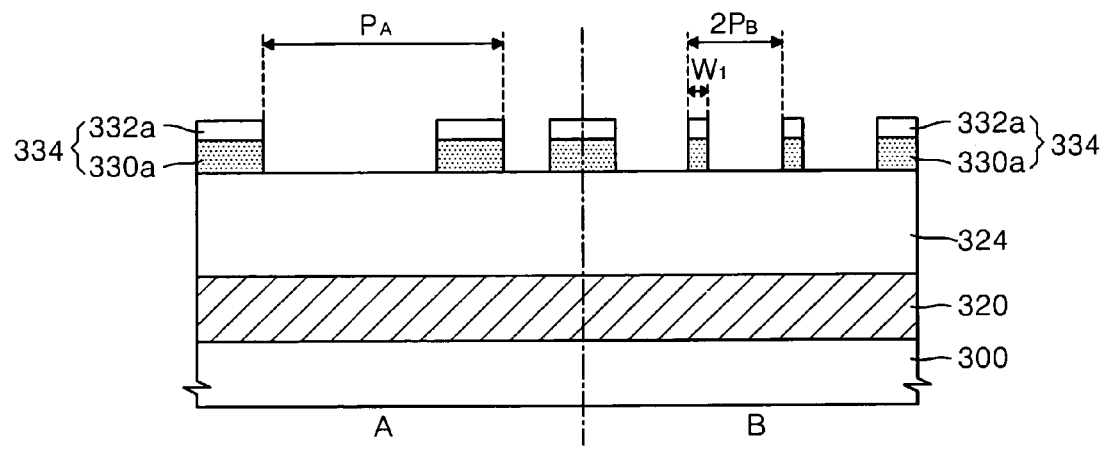

Referring to FIG. 3C, of the buffer mask layer 332 and the first mask layer 330 may be patterned using photolithography, to form a plurality of multi-layered mask patterns 334 by forming first mask patterns 330a stacked on buffer mask patterns 332a.

The multi-layered mask patterns 334 may be constructed by forming the plurality of first mask patterns 330a stacked on the buffer mask patterns 332a that may be repeatedly formed at a pitch $P_A$ equal or substantially equal to the pitch $P_A$ of the patterns to be formed from the etch film 320 in the lower-density pattern region A of the substrate 300. According to other example embodiments, in the higher density pattern region B of the substrate 300, the multi-layered mask patterns 334 may be repeatedly formed at a first pitch $2P_B$ that is twice of a pitch $P_B$ of patterns formed in the etch film 320.

In the higher density pattern region B, a first width $W_1$ of the first mask patterns 330a may have a value equal to about ¼ of the first pitch $2P_B$. The first mask patterns 330a may be, for example, a plurality of line patterns repeatedly formed in a given or desired direction.

Figure 3D:
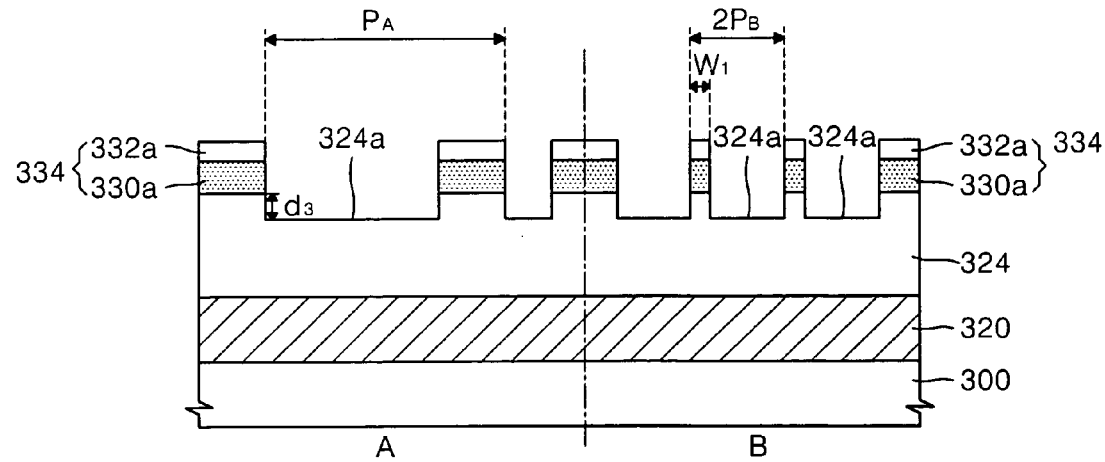

Referring to FIG. 3D, an upper portion having a third thickness $d_3$ of the hardmask layer 324 exposed between the multi-layered mask patterns 334 in the lower-density pattern region A and the higher density pattern region B may be removed, to form lower surface portions 324a of the hardmask layer 324 may be formed.

The third thickness $d_3$ may have a dimension equal or substantially equal to the first width $W_1$ of the first mask patterns 330a.

Forming the lower surface portions 324a on the hardmask layer 324 may be the same or substantially the same as the lower surface portion 124a shown in FIG. 1E.

Figure 3E:
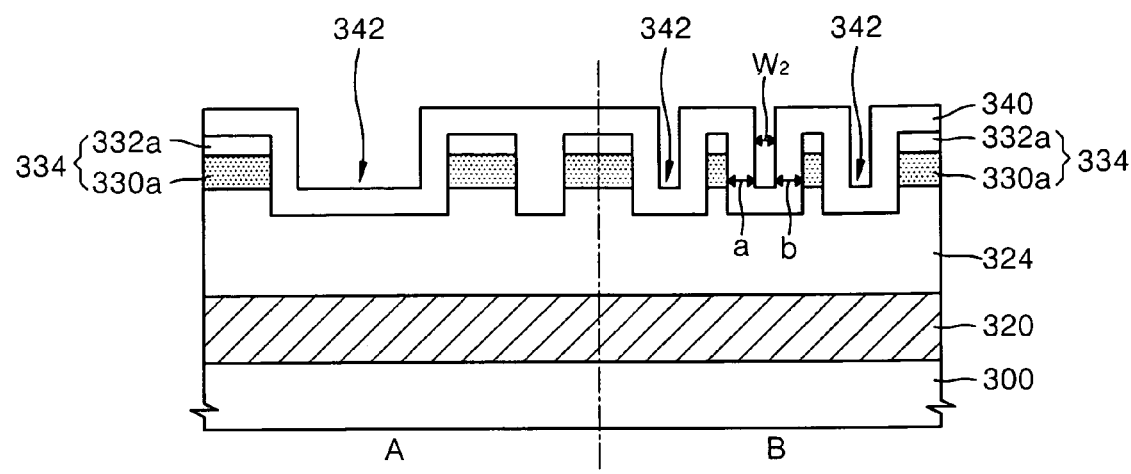

Referring to FIG. 3E, a buffer layer 340 may be formed on sidewalls and upper surfaces of the multi-layered mask patterns 334 and the hardmask layer 324 exposed between the multi-layered mask patterns 334.

The buffer layer 340 may cover (e.g., consistently cover) the multi-layered mask patterns 334 and the low surface portions 324a of the hardmask layer 324 to a thickness equal or substantially equal to the third thickness $d_3$. The thickness of the buffer layer 340 may be determined such that the second width $W_2$ of the recesses 342 is equal or substantially equal to the first width $W_1$ of the first mask patterns 330a in the higher-density pattern region B.

In the lower-density pattern region A or the higher-density pattern region B, if a gap between two adjacent first mask patterns 330a is less than that in the high-density pattern region B, the recesses 342 may not be formed in the upper surface of the buffer layer 340.

The buffer layer 340 may be the same or substantially the same as the buffer layer 140 shown in FIG. 1F.

Figure 3F:
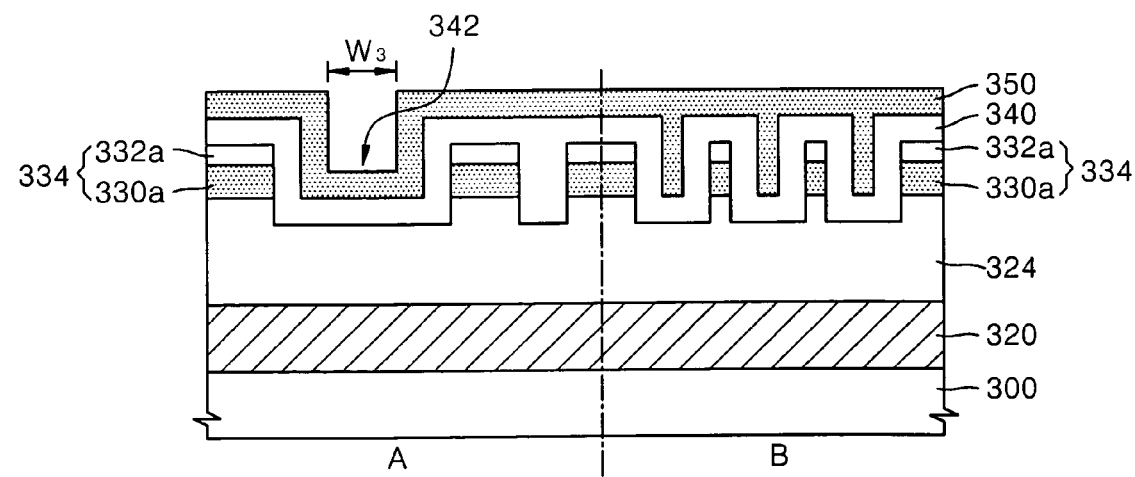

Referring to FIG. 3F, a second mask layer 350 may be formed on the buffer layer 340.

The second mask layer 350 may be thick enough to fill insides of the recesses 342 in the high-density pattern region B. If the gap between the two adjacent first mask patterns 330a in the lower-density pattern region A is greater than that in the higher-density pattern region B, spaces of the recesses 342 of a width $W_3$ may be partially exposed on the second mask layer 350 after forming the second mask layer 350. The spaces of the recesses 342, width $W_3$, may be given, for example.

The second mask layer 350 may be the same or substantially the same as example embodiments of the second mask layer 150 shown in FIG. 1G.

Figure 3G:
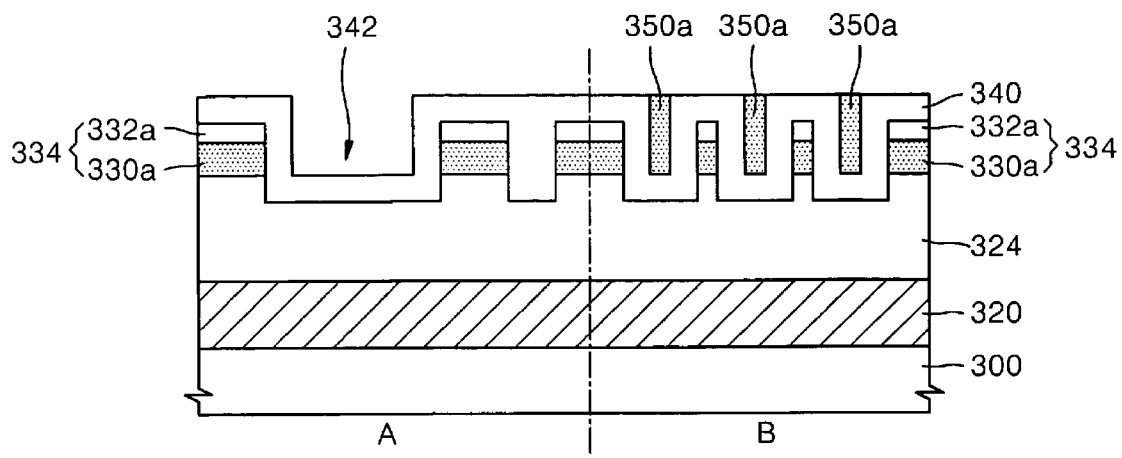

Referring to FIG. 3G, the second mask layer 350 may be at least partially removed until the upper surface of the buffer layer 340 is exposed at the upper surfaces of the first mask patterns 330a to form second mask patterns 350a within the recesses 342 between the stacked structures of the first mask patterns 330a and the buffer mask patterns 332a in the higher-density pattern region B.

Wet etching may be used to remove the second mask layer 330a.

Consequently, the second mask patterns 350a extending as the first mask patterns 350a within the recesses 342 may be formed in the higher density pattern region B. The buffer layer 340 that covers the first mask patterns 330a and the buffer mask patterns 332a may be exposed between the plurality of second mask patterns 350a.

In the lower-density pattern region A, the second mask layer 350 within the recesses 342 may be removed from portions where the gap between the two adjacent first mask patterns 330a is larger than that in the higher-density pattern region B. The second mask layer 350 on the upper surface of the buffer layer 340 may be removed from these portions as well.

Figure 3H:
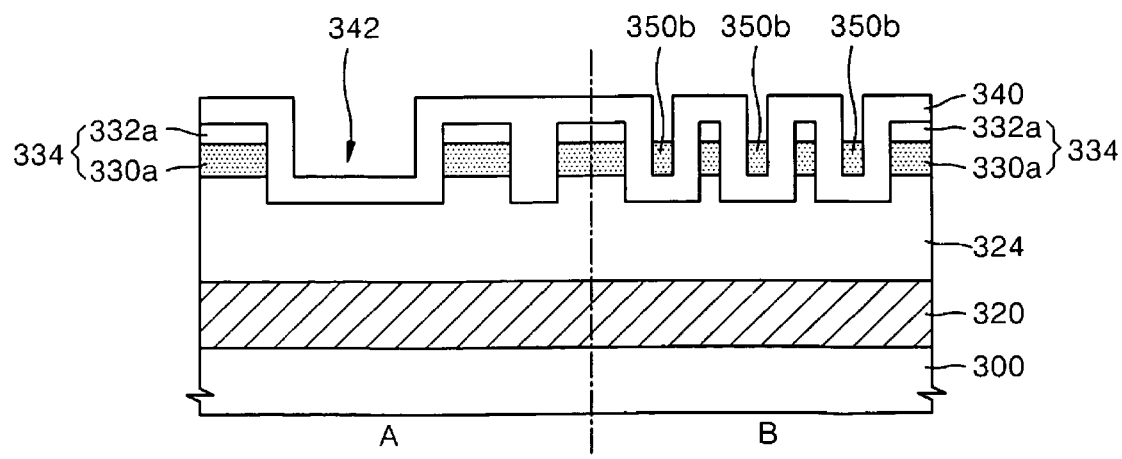

Referring to FIG. 3H, the second mask patterns 350a may be over-etched to reduce and/or eliminate residue of the second mask layer 350 in the lower-density pattern region A from the recesses 342, for example inner corners of the recesses 342. In an additional example, second mask patterns 350b approximately as high as the first mask patterns 330a may be formed in the higher-density pattern region B while the inner sidewalls of the recesses 342 are partially exposed. The over-etching upon the second mask patterns 350a may be performed while the buffer mask patterns 332a are formed on the first mask patterns 330a, for example. Therefore, in further example embodiments, an etch process margin as large as the height of the buffer mask patterns 332a may be obtained when over-etching the second mask patterns 350a.

Figure 3I:
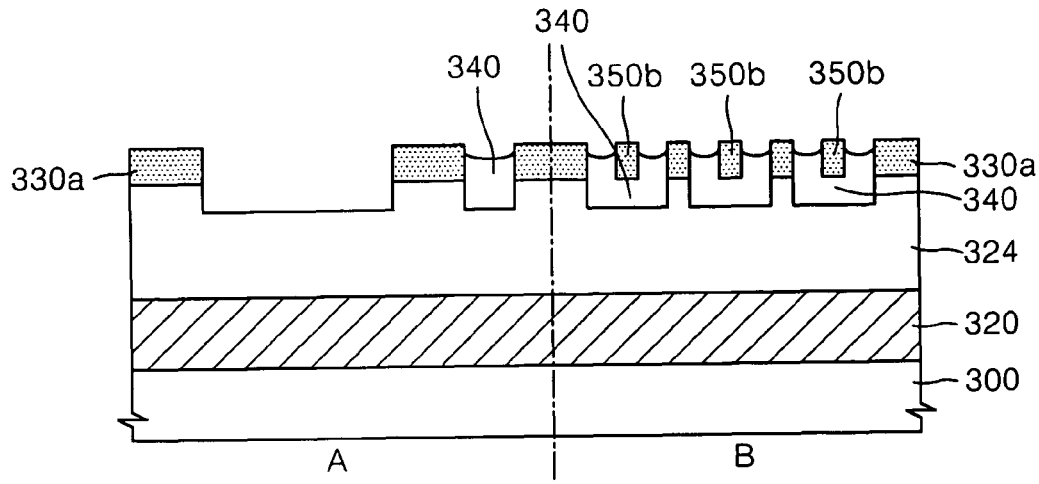

Referring to FIG. 3I, using the second mask patterns 350b as an etch mask, the exposed portions of the buffer layer 340 and the buffer mask patterns 332a that cover the first mask patterns 330a may be removed to expose upper surfaces of the first mask patterns 330a. In additional example embodiments, the upper surfaces of the first mask patterns 330a and the second mask patterns 350b may be simultaneously exposed.

Example embodiments show wet or dry etching may be used to remove the portions of the buffer layer 340 and the buffer mask patterns 332a. For example, when the first mask patterns 330a and the buffer mask patterns 332a are an oxide-based film or the like, the same or substantially the same etching conditions may be applied to remove them.

As a result, the lower-density pattern region A may include portions where the buffer layer 340 remains between the first mask patterns 330a and portions where the buffer layer 340 may be completely removed between the first mask patterns 330a according to the density of the first mask patterns 330a. The buffer layer 340 may remain between the first mask patterns 330a in the higher density pattern region B.

Figure 3J:
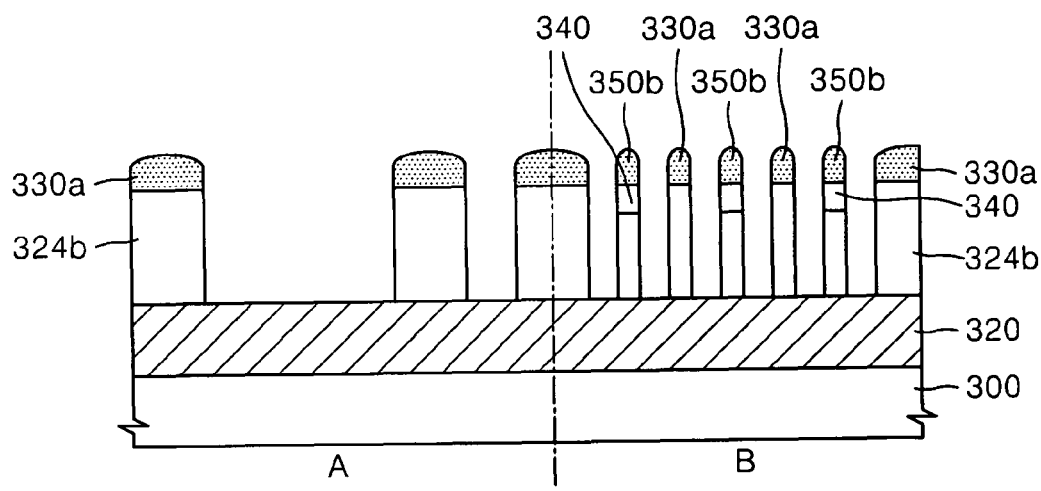

Referring to FIG. 3J, the buffer layer 340 exposed between the first mask patterns 330a and the second mask patterns 350b may be removed using first mask patterns 330a and second mask patterns 350b as an etch mask, so that the hardmask layer 324 may be exposed between the first mask patterns 330a and the second mask patterns 350b.

Using the first mask patterns 330a and the second mask patterns 350b as an etch mask, the hardmask layer 324 may be etched to form hardmask patterns 324b exposing the upper surface of the etch film 320.

During etching of the hardmask layer 324, the first mask patterns 330a and the second mask patterns 350b may be partially etched as shown in FIG. 3J.

Figure 3K:
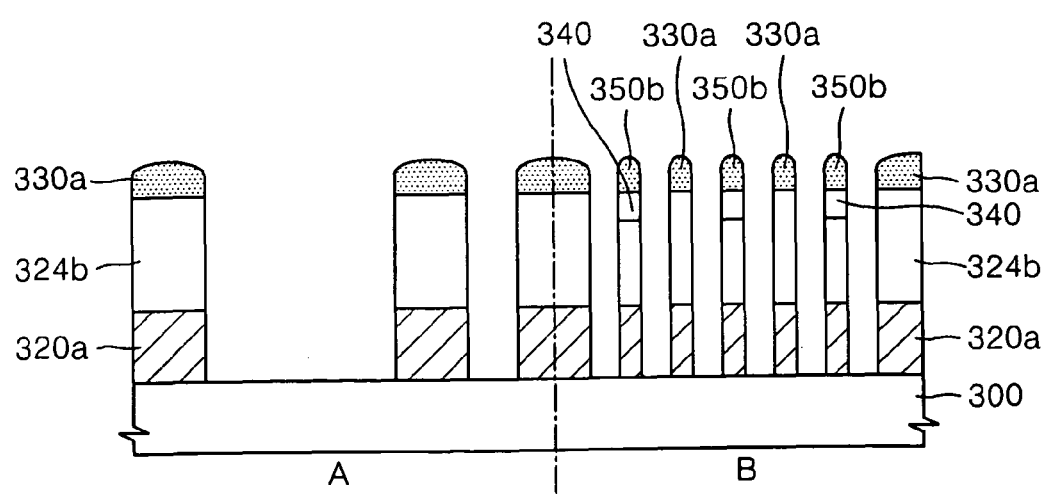

Referring to FIG. 3K, using the hardmask patterns 324b and the first mask patterns 330a and the second mask patterns 350b left on the hardmask patterns 324b as an etch mask, the etch film 320 may be anisotropically dry etched to form fine patterns 320a. The fine patterns 320a may have pattern densities different from each other in the lower-density pattern region A and the higher-density pattern region B.

Because example embodiments of anisotropic dry etching may be performed using the first mask patterns 330a and the second mask patterns 350b formed by double patterning when the etch film 320 is etched to form the fine patterns 320a, the fine patterns 320a with the fine pitch that exceeds photolithographic resolution restrictions may be embodied in the higher-density pattern region B. For example, when forming the first mask patterns 330a and the second mask patterns 350b by double patterning, the forming of the second mask patterns 350b may be performed while the upper surfaces of the first mask patterns 330a are covered with the buffer mask patterns 332a. The etch process margin provided by the thickness of the buffer mask patterns 332a may be obtained when the second mask patterns 350a are over-etched to suppress and/or prevent residues of the second mask layer 350 on the portions from which the second mask layer 350 has to be removed in the low-density pattern region A. According to example embodiments, unnecessary residue may be reduced and/or eliminated by over-etching and/or simultaneously, inconsistent etching caused by the height difference of the first mask patterns 330a and the second mask patterns 350b may be decreased and/or prevented. For example, fine patterns are formed by double patterning, the fine patterns having different pattern densities in the lower-density pattern region A and the higher-density pattern region B may be achieved.

In example embodiments of methods of forming fine patterns of a semiconductor device, when simultaneously forming patterns of diverse dimensions with diverse pitches on a single substrate, buffer mask patterns for providing an etch process margin may be formed on upper surfaces of first mask patterns during over-etching. Thus, when second mask patterns are formed from the second mask layer in regions having different pattern densities, over-etching to reduce and/or prevent unnecessary residues of the second mask layer from remaining on a substrate. In example embodiments, even when a surface configuration with grooves is obtained in the upper surfaces of the second mask patterns, the second mask patterns may be over-etched to reduce and/or eliminate a height difference between the first mask patterns and the second mask patterns caused by the grooves with the sufficient process margin by forming the buffer mask patterns. While decreasing and/or preventing unnecessary film materials from remaining on the substrate during performing double patterning, inconsistent etching resulting from the height difference of the first mask patterns and the second mask patterns used as the etch mask may be reduced and/or prevented. When simultaneously forming the patterns of diverse dimensions with diverse pitches on the single substrate using double patterning, an etch process margin of sufficient size may be obtained. According to example embodiments the patterns with fine pitch, which overcome photolithographic resolution restrictions may be realized.

The above-disclosed subject matter is to be considered illustrative and not restrictive, and the appended claims are intended to cover all such modifications, enhancements, and other example embodiments, which fall within the true spirit and scope of the present invention. Thus, to the maximum extent allowed by law, the scope of the present invention is to be determined by the broadest permissible interpretation of the following claims and their equivalents, and shall not be restricted For limited by the foregoing detailed description.

What is claimed is:

1. A method of forming fine patterns for a semiconductor device, the method comprising:
   forming a plurality of multi-layered mask patterns on an etch film on a substrate, each of the plurality of multi-layer mask patterns including a first mask pattern and a buffer mask pattern;
   forming a second mask pattern in spaces between the plurality of multi-layered mask patterns, each second mask pattern having an upper surface lower than an upper surface of the plurality of multi-layered mask patterns;
   removing the plurality of buffer mask patterns to expose upper surfaces of the first mask patterns; and
   forming the fine patterns by etching the etch film using the first mask patterns and the second mask patterns as an etch mask.

2. The method of claim 1, further including,
   forming a hardmask layer on the substrate,
   forming the etch film on the hardmask layer, and
   forming hardmask patterns by etching the hardmask layer using the first mask patterns and the second mask patterns as an etch mask,
   wherein the etch film is etched using the first mask patterns, the second mask patterns and the hardmask patterns as an etch mask to form the fine patterns.

3. The method of claim 1, wherein forming the plurality of multi-layered mask patterns includes
   forming a first mask layer on the etch film of the substrate,
   forming a buffer mask layer by depositing on the first mask layer a material different than a material that comprises the first mask layer, and
   forming the first mask patterns and the buffer mask patterns by patterning the buffer mask layer and the first mask layer using photolithography.

4. The method of claim 1, wherein forming the plurality of multi-layered mask patterns includes,
   forming a first mask layer on the etch film of the substrate,
   forming a buffer mask layer by oxidizing the first mask layer to a depth from an upper surface thereof, and
   forming the first mask patterns and the buffer mask patterns by patterning the buffer mask layer and the first mask layer using photolithography.

5. The method of claim 1, wherein forming the second mask patterns includes:
   forming a buffer layer that covers upper surfaces and sidewalls of the plurality of multi-layered mask patterns to have recesses in spaces between the multi-layered mask patterns,
   forming a second mask layer on the buffer layer to fill insides of the recesses, and
   forming the second mask patterns having upper surfaces at a first height by removing the second mask layer until the buffer layer is exposed at the upper surfaces of the multi-layered mask patterns to form the second mask patterns only within the recesses.

6. The method of claim 5, wherein the buffer layer is formed of an oxide film.

7. The method of claim 5, wherein, after forming the second mask patterns having the upper surfaces at the first height, the forming of the second mask patterns further includes removing a thickness from the upper surfaces of the second mask patterns having the first height using the exposed buffer layer as an etch mask to form the second mask patterns having a second height smaller than the first height and, simultaneously, to expose portions of the buffer layer that cover the sidewalls of the buffer mask patterns within the recesses.

8. The method of claim 7, wherein the second height is equal to the height of the first mask patterns.

9. The method of claim 7, further including removing the exposed portions of the buffer layer, using the second mask patterns having the second height as an etch mask,
   wherein the buffer mask patterns are simultaneously removed during the removing of the exposed portions of the buffer layer.

10. The method of claim 1, wherein
the first mask patterns and the second mask patterns are formed of polysilicon films, and
the buffer mask patterns are formed of oxide films.

11. The method of claim 1, wherein fine patterns formed in a first region of the substrate have a different pattern density than fine patterns formed in a second region of the substrate.

12. The method of claim 11, wherein the plurality of multi-layered mask patterns have a first pattern density in the first region and a second pattern density in the second region, and the second mask patterns are formed only in the second region.

13. The method of claim 12, further including:
forming a hardmask layer on the etch film, and
forming the hardmask patterns by etching the hardmask layer using the first mask patterns and the second mask patterns as an etch mask,
wherein the etch film is etched to form the fine patterns using the first mask patterns, the second mask patterns, and the hardmask patterns as an etch mask.

14. The method of claim 12, wherein forming the plurality of multi-layered mask patterns includes,
forming a first mask layer on the etch film,
forming a buffer mask layer by depositing a material on the first mask layer different than a material that comprises the first mask layer, and
forming the first mask patterns and the buffer mask patterns by patterning the buffer mask layer and the first mask layer using photolithography.

15. The method of claim 12, wherein the forming of the plurality of multi-layered mask patterns includes,
forming a first mask layer on the etch film,
forming a buffer mask layer by oxidizing the first mask layer to a depth from the upper surface thereof, and
forming the first mask patterns and the buffer mask patterns by patterning the buffer mask layer and the first mask layer using photolithography.

16. The method of claim 12, wherein the first mask patterns and the second mask patterns comprise polysilicon layers, and
the buffer mask patterns are formed of an oxide film.

17. The method of claim 12, wherein the forming of the second mask patterns includes,
forming a buffer layer that covers upper surfaces and sidewalls of the plurality of multi-layered mask patterns to form recesses in spaces between the plurality of multi-layered mask patterns,
forming second mask layer on the buffer layer to fill insides of the recesses formed in the second region, and
forming the second mask patterns having upper surfaces at a first height by removing the second mask layer until the buffer layer is exposed at the upper surfaces of the multi-layered mask patterns to leave the second mask patterns only within the recesses that are formed in the second region.

18. The method of claim 17, wherein the buffer layer is formed of an oxide film.

19. The method of claim 17, wherein, after the forming of the second mask patterns having upper surfaces of the first height, the forming of the second mask patterns includes removing a thickness from the upper surfaces of the second mask patterns having the first height to form the second mask patterns having upper surfaces at a second height smaller than the first height using the buffer layer exposed in the second region as an etch mask, and simultaneously, to expose a portion of the buffer layer that covers the sidewalls of the buffer mask patterns in the insides of the recesses.

20. The method of claim 19, wherein the second height is equal to a height to the upper surfaces of the first mask patterns.

21. The method of claim 19, wherein, while the second mask patterns having the upper surfaces at the second height are formed, the buffer layer is removed from the spaces between the plurality of multi-layered mask patterns in the first region.

22. The method of claim 19, further including removing exposed portions of the buffer layer in the first region and the second region using the second mask patterns having upper surfaces at the second height,
wherein the buffer mask patterns are removed while the exposed portions of the buffer layer are removed.

* * * * *